United States Patent [19]
Chen et al.

[11] Patent Number: 6,032,994
[45] Date of Patent: Mar. 7, 2000

[54] TOOLS FOR POSITIONING SEMICONDUCTOR CHIP TEST PROBES

[75] Inventors: Cindy Chen, Hsin-Chuang; Liza Chen, Hsinchu; Jiuan Lai, Chang-Hua Hsiang; Jessie Chang, Hsinchu; Kelly Liao, Tao-Yuan Hsiang, all of Taiwan

[73] Assignees: ProMOS Technologies Inc.; Mosvel Vitelic Inc., both of Hsinchu, Taiwan; Siemans AG, Munich, Germany

[21] Appl. No.: 09/200,299

[22] Filed: Nov. 25, 1998

[51] Int. Cl.[7] ............................... B25J 7/00; G01R 31/02
[52] U.S. Cl. ............................................. 294/1.1; 294/902
[58] Field of Search .............................. 294/1.1, 15, 19.1, 294/24, 902; 324/754, 756–758, 765; 29/758; 414/941

[56] References Cited

U.S. PATENT DOCUMENTS

| 3,048,139 | 8/1962 | Duckett | 294/24 |
| 4,823,654 | 4/1989 | Moore | 294/19.1 |
| 5,265,326 | 11/1993 | Scribner | 29/758 |
| 5,457,392 | 10/1995 | Filipescu | 324/757 |
| 5,481,205 | 1/1996 | Frye et al. | 324/757 |

FOREIGN PATENT DOCUMENTS

| 1-219566 | 9/1989 | Japan | 324/757 |
| 2-257075 | 10/1990 | Japan | 324/757 |

*Primary Examiner*—Dean J. Kramer
*Attorney, Agent, or Firm*—Blakely Sokoloff Taylor & Zafman

[57] ABSTRACT

In a semiconductor test equipment, in which test probes are placed into contact with bonding pads of semiconductor chips on a semiconductor wafer, an adjustment tool for adjusting the position of the test probes is disclosed. The adjustment tool comprises a cylindrical base portion, a triangular intermediate portion, and a flat, rectangular tip portion. The tool is preferably formed of used test probes comprised of tungsten. The tool is plated with a titanium nitride layer to increase the life of the tool.

3 Claims, 2 Drawing Sheets

TOOLS FOR POSITIONING SEMICONDUCTOR CHIP TEST PROBES

FIELD OF THE INVENTION

This invention relates generally to the testing of semiconductor chips through the use of a probe card having needle-tipped probes, and, in particular, to tools for positioning the needle-tipped probes.

BACKGROUND OF THE INVENTION

Semiconductor chips are produced in a checkerboard pattern on a semiconductor wafer. In the manufacturing process for semiconductor chips, to increase manufacturing efficiency each individual semiconductor chip formed on the semiconductor wafer is tested by placing needle-tipped test probes into contact with the bonding pads of the chip and by applying and detecting test signals through the test probes. After the test is completed, the individual chips are separated before being passed to the assembly process. Chips that are found defective in testing are dropped from the assembly process.

More specifically, electric contact between semiconductor chip test equipment and each chip on a wafer is accomplished by use of a printed board which is called a "probe card." The probe card has an opening to provide access to the semiconductor wafer. The opening is surrounded by conductive pads connected by the probe card to card terminals for connection to appropriate test equipment. The needle-tipped test probes formed of tungsten are affixed to selected conductive pads. The test probes extend over the opening.

In operation, a wafer is placed below the probe card. The length and orientation of each test probe is such that its tip is adapted to engage a respective bonding pad on a semiconductor chip on a wafer. To make effective contact, the tip of the test probe must press down on the bonding pads with sufficient force to ensure a positive connection therewith. Over a period of use, the test probes become distorted or misaligned.

Therefore, a need arises for tools to reposition distorted or misaligned test probes. Particularly with the shrinking sizes of semiconductor chips and the extremely small distances between the test probes, the tools should be precise. Further, the cost of making the tools should be low.

SUMMARY OF THE INVENTION

In a semiconductor test equipment, in which test probes are placed into contact with the bonding pads of semiconductor chips on a semiconductor wafer, an adjustment tool for adjusting the position of the test probes is disclosed. The adjustment tool comprises a cylindrical base portion, a triangular intermediate portion, and a flat, rectangular tip portion. The tool is preferably formed of used test probes comprised of tungsten. The tool is plated with a titanium nitride layer to increase the life of the tool.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

FIGS. 1A to 3 show three embodiments of a tool for adjusting distorted or misaligned test probes used in testing semiconductor chips. The tools according to all three embodiments of the present invention are preferably formed from discarded test probes. The discarded test probes are filed down by a drill with a sandpaper tip or any other suitable method to form the tools. As the discarded test probes would otherwise be useless, the cost of materials in manufacturing the tools is low. Furthermore, test probes are generally formed of tungsten. Tungsten is particularly suitable for forming the tools because it is the same material that the test probes are formed of, making it less likely to damage the test probe tips.

Figure 1A:
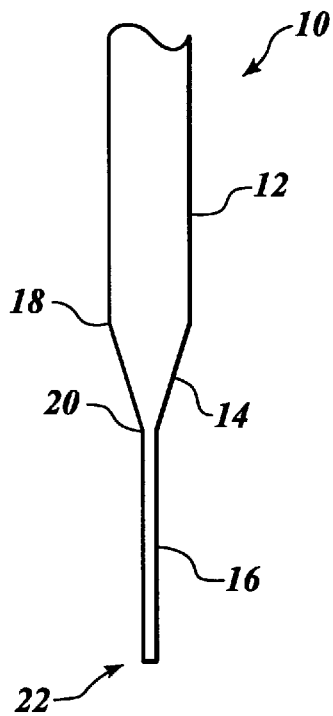
FIG. 1A is a cross-sectional side view of a tool according to a first embodiment of the present invention.
Figure 1B:
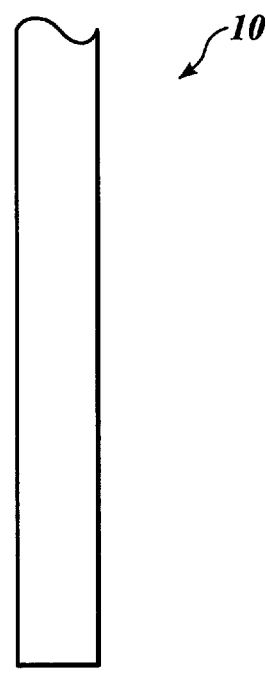
FIG. 1B is a cross-sectional front view of the tool shown in FIG. 1A.

Turning to FIGS. 1A and 1B, a test probe positioning tool according to a first embodiment of the present invention is shown. The tool according to the first embodiment will hereinafter be referred to as an adjustment tool 10. FIG. 1A shows a cross-sectional side view of the adjustment tool 10 and FIG. 1B shows a cross-sectional front view of the adjustment tool 10.

The adjustment tool 10 has three integrally formed portions: the base portion 12, the intermediate portion 14 and the tip portion 16. The base portion 12 is cylindrical in shape and is preferably about 500 μm in diameter and 5 mm in length. The intermediate portion 14 starts at one end 18 of the base portion 12 and converges into an elongated apex 20. The intermediate portion is preferably about 1.5 mm in height. The tip portion 16 extends from the elongated apex 20 of the intermediate portion and forms a rectangular surface 22 at its free end that is preferably about 100 μm by 500 gm. The tip portion 16 is preferably about 3.5 mm in length. In an alternative embodiment, the base portion 12 and the intermediate portion 14 can be omitted.

Figure 2A:
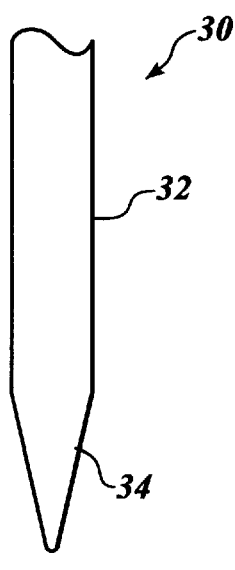
FIG. 2A is a cross-sectional side view of a tool according to a second embodiment of the present invention.
Figure 2B:
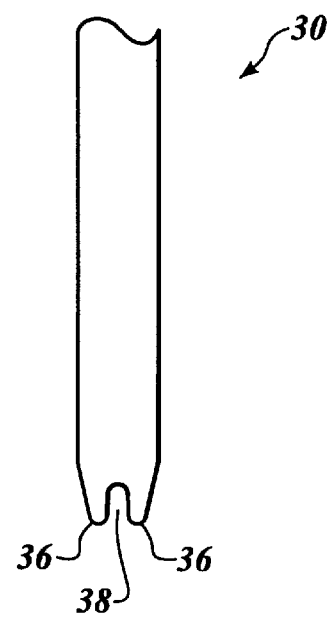
FIG. 2B is a cross-sectional front view of the tool shown in FIG. 2A.

FIGS. 2A and 2B show a second embodiment of a tool according to the present invention. The tool according to the second embodiment will be referred to as a depressor tool 30. FIG. 2A is a cross-sectional side view of the depressor tool 30 and FIG. 2B is a cross-sectional front view of the depressor tool 30. The depressor tool has a base portion 32 and a tip portion 34.

The base portion is cylindrical in shape and is preferably about 500 μm in diameter and 9.7 mm in length. As can be seen in FIG. 2A, the tip portion 34 has a triangular side profile. As can be seen in FIG. 2B, the tip portion 34 forms two circular surfaces 36 at its free end. The circular surfaces 36 are preferably about 50 μm in diameter and are spaced approximately 200 μm apart. The tip portion 34 has a concave area 38 between the two circular surfaces 36. The concave area 38 can be used to depress a test probe longitudinally.

Figures 3, 4:
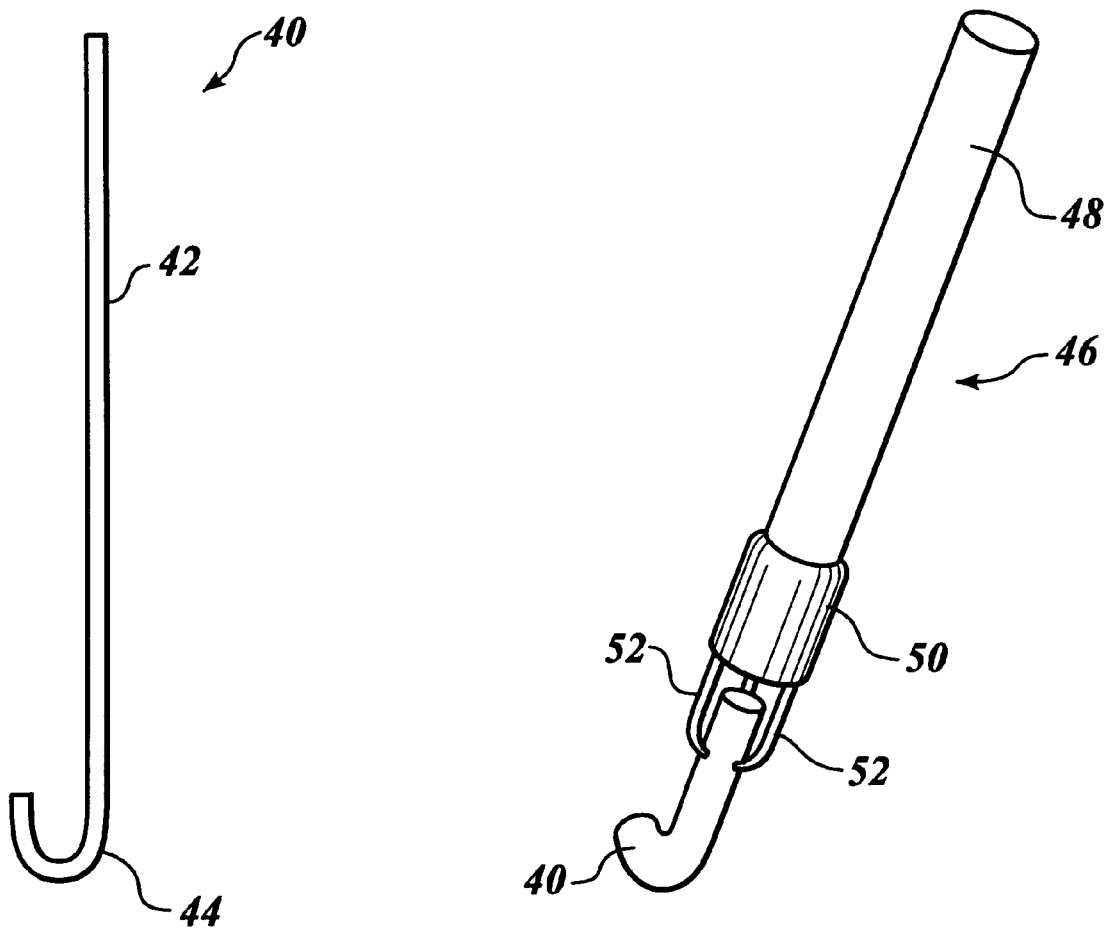
FIG. 3 is a cross-sectional side view of a tool according to a third embodiment of the present invention.
FIG. 4 is a perspective view of the tool shown in FIG. 3, held by a handling device.

FIG. 3 shows a cross-sectional side view of a tool according to a third embodiment of the present invention. The tool according to the third embodiment will be referred to as a hook tool 40. The hook tool 40 has a base portion 42 and a hook portion 44. The base portion 42 is cylindrical in shape and is preferably about 200 μm in diameter and 920 mm in length. The hook portion 44 is preferably substantially U-shaped and is about 200 μm in its diameter thickness. The "U" formed by the hook portion is preferably about 800 μm in height and 1 mm in width. The hook tool 40 is formed by heating the discarded test probe to about 100° C. and bending the tip of the test probe into a hook shape. Then, the hook tool 40 is cooled.

To increase the life of the tool according to all three embodiments, a layer of titanium nitride (TiN) is deposited onto the surface of the tool. The TiN can be deposited by physical vapor deposition or other known suitable methods. Preferably, the TiN is about 3 to 5 μm in thickness. A 3 to 5 μm thick layer of TiN increases the life of the tool about 5 to 7 times.

The tools are held by a handling device 46 as shown in FIG. 4. FIG. 4 shows a hook tool 40 held by the handling device 46. However, it is understood that the handling device 46 can be used to handle the adjustment tool 10 and the depressor tool 30. The handling device 46 uses a pinch method to hold the hook tool 40. The handling device 46 includes a handle portion 48 for a user to hold and maneuver the handling device 46. A rotatable portion 50 is rotated in one direction to move a plurality of pinchers 52 centrally inward to hold the hook tool 40 in place. The rotatable portion 50 is rotated in an opposite direction to move the plurality of pinchers 52 outward to release the hook tool 40. There are at least two pinchers 52 and preferably, there are at least three pinchers 52. The handle portion 48 and the rotatable portion 50 can be formed of any suitable material, such as metal or plastic. The pinchers 52 can be formed of metal or any other suitable material. In an alternative embodiment, the tool can be affixed to an elongated stick formed of a rigid material.

While the preferred embodiment of the invention has been illustrated and described, it will be appreciated that various changes can be made therein without departing from the spirit and scope of the invention.

What is claimed is:

1. In a semiconductor test equipment, in which test probes are placed into contact with bonding pads of semiconductor chips on a semiconductor wafer, a depressor tool for adjusting the position of the test probes, the depressor tool comprising:

a cylindrical base portion having a length of about 10 millimeters; and a tip portion having an outer layer of titanium nitride and having a means for engaging and maneuvering said test probes, said means for engaging and maneuvering comprising a concave area, said concave area having a width of about 200 micrometers.

2. The depressor tool according to claim 1, wherein the tool is formed from used test probes.

3. The depressor tool according to claim 1, wherein the tool is formed from tungsten.

* * * * *